United States Patent
Yoon et al.

(10) Patent No.: US 6,198,658 B1
(45) Date of Patent: Mar. 6, 2001

(54) HIGH DENSITY FLASH MEMORY ARCHITECTURE WITH COLUMNAR SUBSTRATE CODING

(75) Inventors: Sukyoon Yoon, Saratoga; Pavel Klinger, San Jose; Joo Young Yoon, Santa Clara, all of CA (US)

(73) Assignee: Hyundai Electronics America, Inc., San Jose, CA (US)

( * ) Notice: Subject to any disclaimer, the term of this patent is extended or adjusted under 35 U.S.C. 154(b) by 0 days.

(21) Appl. No.: 09/415,770

(22) Filed: Oct. 8, 1999

(51) Int. Cl.$^7$ ................................................. G11C 11/40
(52) U.S. Cl. .............................. 365/185.05; 365/185.06; 365/185.18; 257/314; 257/315; 257/316; 257/371; 257/390
(58) Field of Search ..................... 365/185.18, 185.05, 365/185.06; 257/314, 315, 316, 371, 390

(56) References Cited

U.S. PATENT DOCUMENTS

| | | | | |
|---|---|---|---|---|
| 4,905,062 | * | 2/1990 | Esquivel | 357/23.5 |
| 5,010,028 | * | 4/1991 | Gill et al. | 437/43 |
| 5,060,195 | * | 10/1991 | Gill et al. | 365/185.01 |
| 5,467,305 | * | 11/1995 | Bertin et al. | 365/185.01 |
| 5,646,888 | * | 7/1997 | Mori | 365/185.33 |
| 5,680,345 | * | 10/1997 | Hsu et al. | 365/185.01 |
| 5,923,063 | * | 7/1999 | Liu et al. | 257/316 |
| 6,011,288 | * | 1/2000 | Lin et al. | 257/311 |

OTHER PUBLICATIONS

Prince, Betty, *Semiconductor Memories, A Handbook of Design, Manufacture and Application*, 2nd Ed., pp. 586–604, John Wiley & Sons (1983).

* cited by examiner

*Primary Examiner*—Viet Q. Nguyen
(74) *Attorney, Agent, or Firm*—Townsend and Townsend and Crew LLP

(57) ABSTRACT

Instead of using a common substrate (101) for each sector of a flash memory, trenches are used to isolate columnar active substrate regions (304) of the substrate (101), and independent access to each of these columnar regions (304) is provided. First, the independent access to each of these columnar regions (304) provides a capability for achieving more precise control over the voltage on the floating gates (106). For example, flash memory in accordance with the present invention is better suited for multi-level storage (storing of more than 1 bit of information per cell). Second, the independent access to each of these columnar regions (304) also provides a capability for areas of flash memory smaller than an entire sector to be erased at one time. Finally, since both programming and erasing is achieved by way of cold electron tunneling from the columnar active substrate region (304), no high voltages need to be applied to either the drain (102) or source (104). This is advantageous in that the minimum distance required by cell punchthrough is reduced. Hence, higher densities of flash memory may be achieved.

22 Claims, 9 Drawing Sheets

Shallow Trench Isolation (STI) with N+ implant

Deep Trench Isolation

Shallow Trench Isolation (STI) with N+ implant

HIGH DENSITY FLASH MEMORY ARCHITECTURE WITH COLUMNAR SUBSTRATE CODING

BACKGROUND OF THE INVENTION

Flash memory was originally developed as a derivative of Erasable Programmable Read Only Memory (EPROM). Conventional EPROM technology uses hot electron injection (also called avalanche injection) to program the memory and ultraviolet (UV) light to erase the contents of the memory. Avalanche injection of electrons into the floating gate is achieved by applying high positive voltage to both the drain and the control gate, and grounding the source. Exposing the cell to UV light increases the energy of the floating gate electrons to a level where they may jump the energy barrier between the floating gate and the oxide.

Conventional single-transistor cell flash memory technology is similar to single-transistor cell EPROM technology. However, flash memory allows for electrical erasure of the contents of the memory, either of the entire memory array at once or of a sector of the memory at once, by way of cold electron tunneling (also called Fowler-Nordheim tunneling).

An example of a conventional single-transistor cell for flash memory is illustrated in FIG. 1. Such a flash memory cell typically has thinner oxide under the floating gate (between the floating gate (106) and the channel) than an EPROM cell has. The thinner oxide allows for erasure to be achieved via cold electron tunneling between the floating gate (106) and the source (104).

Like programming of EPROM, programming of conventional single-transistor cell flash memory is typically performed by applying high positive voltage to both the drain (102) via the bitline and the control gate (108) via the wordline, while grounding the source (104). This causes hot electron injection from the substrate (101) near the drain (102) to the floating gate (106). This programming by way of hot electron injection is crude in that the charge stored in the floating gate (106) is difficult to control precisely. This inability to control precisely the charge stored in the floating gate (106) is a first disadvantage of conventional single-transistor cell flash memory. This disadvantage makes it difficult to store multi-levels (i.e. more than one bit of information) in a flash cell.

Erasure of conventional single-transistor cell flash memory may be performed by applying a high positive voltage (for example, plus 12 volts) to the substrate (101)and grounding the control gates (108) in a sector. This causes the tunneling of the electrons from the floating gates (106) to the sources (104). Portions of the memory smaller than a sector cannot be erased because the common substrate is shared by all cells in a sector. The size of a sector may be, for example, 512 kilobits of cells for a 4 megabit flash memory organized into 8 sectors. Thus, the inability to erase portions of the memory smaller than a sector is a second disadvantage of conventional single-transistor cell flash memory.

As an alternative to using single-transistor cells, conventional flash memory may instead utilize cells with two or more transistors. For example, each cell may include two transistors: one being a select transistor; and the other being a storage transistor. Utilizing such multiple-transistor cells, erasure of portions as small as a single word have been achieved. However, such multiple-transistor cells are substantially larger than single-transistor cells, and hence are not suitable for high density flash memory applications.

Cell size in conventional flash memory is limited by cell punchthrough requirements. Cell punchthrough occurs when the depletion region of the drain junction merges with the depletion region of the source junction. In order to prevent cell punchthrough, a minimum distance is typically required between drain (102) and source (104) along a bitline (or column). The higher the maximum voltage applied to a drain during operation, the larger the minimum distance must be. In this way, cell punchthrough limits the size of cells along the columnar direction, and so is a third disadvantage of conventional single-transistor cell flash memory.

SUMMARY OF THE INVENTION

The present invention relates to flash memory technology which overcomes the disadvantages and problems discussed above. Instead of using a common substrate (101) for each sector, the present invention uses trenches to isolate columnar active substrate regions (304) of the substrate (101) and further provides circuitry for independent access to each of these columnar regions (304).

As a first advantage, the independent access to each of these columnar regions (304) provides a capability for achieving more precise control over the charge on the floating gates (106). For example, flash memory in accordance with the present invention is better suited for multi-level storage (storing of more than 1 bit of information per cell). Since each bitline may be accessed individually during erase, as well as during programming, a capability is provided to correct for any "overshoot" during the programming of a bit. Programming algorithms may use this capability in order to achieve the storage of more precise voltage levels which is needed for multi-level storage. In addition, additional precision in the control of the stored voltage levels is provided by the present invention because both programming and erase utilize a tunneling mechanism, instead of an injection mechanism.

As a second advantage, the independent access to each of these columnar regions (304) provides a capability for areas of flash memory smaller than an entire sector to be erased at one time. Without columnar substrate isolation, all cells would be erased (or at least the charge on the floating gates would be substantially disturbed) by way of the common substrate even if the sources of individual rows were disconnected (or decoded). With columnar substrate isolation, as few as one or two wordlines (also called rows) may be erased at one time by applying a high negative voltage to control gates (108) of the selected wordline, a small positive voltage to the control gates (108) of the unselected wordlines, and a high positive voltage to the active substrate regions (304), while allowing the sources (104) and drains (102) to float. In this case, the n-polarity source line (504) corresponding to the selected wordline (108) floats to a level near to the positive voltage of the active substrate regions (304). Hence, if each wordline has its own source line (504), then one wordline at a time may be so erased. Alternatively, if two neighboring wordlines share a common source line (504), then two neighboring wordlines at a time may be so erased. Moreover, even smaller than one or two word lines, a single cell may be erased by applying a high negative voltage to the control gates (108) in a selected wordline, a small positive voltage to unselected wordlines to serve as an inhibit voltage, grounding the columnar active substrate region (304) corresponding to a particular bitline, and allowing the drains (102) and sources (104) to float. In this case, no voltage is induced in the floating source line (504) because ground does not induce any potential in the floating terminal. Hence, a single cell may be erased.

As a third advantage, since both programming and erasing is achieved by way of cold electron tunneling from the columnar active substrate region (304), no high voltages need to be applied to either the drain (102) or source (104). This is advantageous in that the minimum distance required by cell punchthrough is reduced. As a result, the size of the cell may be reduced along the columnar direction. Hence, higher densities of flash memory may be achieved.

DESCRIPTION OF THE SPECIFIC EMBODIMENTS

Figure 1:
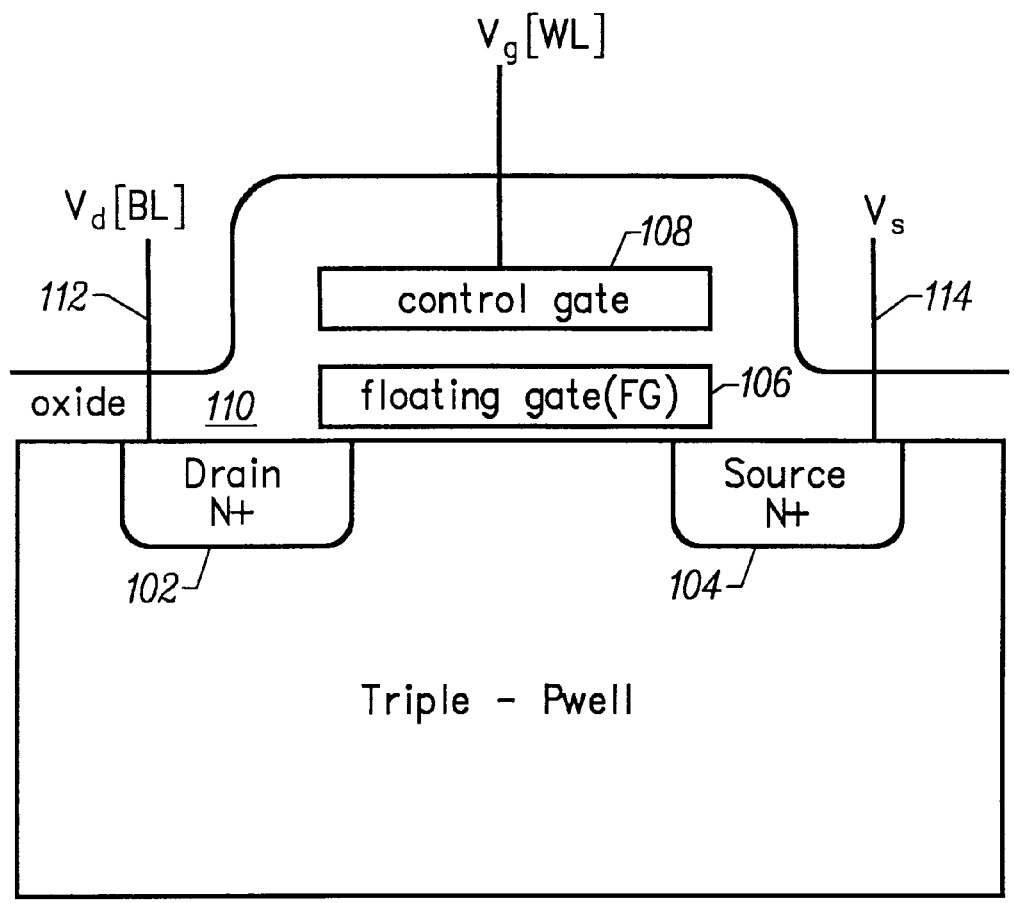
FIG. 1 is a cross-sectional schematic diagram illustrating a conventional single-transistor flash memory cell.
Figure 2:
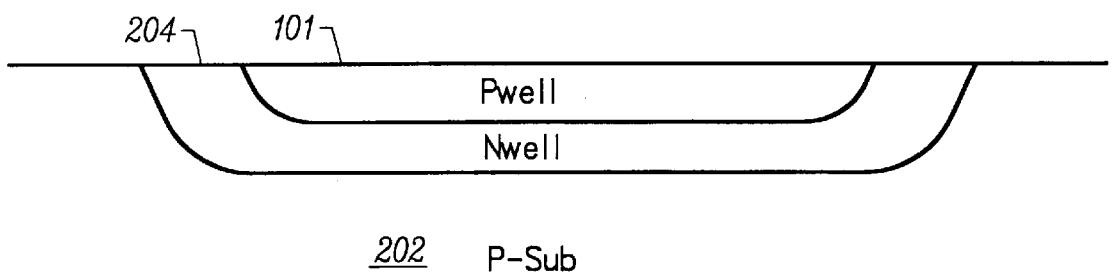
FIG. 2 is a cross-sectional schematic diagram illustrating a conventional triple-well substrate configuration.

FIG. 1 is a cross-sectional schematic diagram illustrating a conventional single-transistor flash memory cell. The conventional cell is shown as being based on a triple p-well (101) which is the topmost well of a conventional triple well substrate configuration. Such a conventional triple well substrate configuration is illustrated in FIG. 2.

The conventional cell includes a n+ doped drain (102), a n+ doped source (104), a floating gate (FG) (106), a control gate (108), oxide (110), a drain contact (112), and a source contact (114). The drain voltage is represented by Vd, the source voltage is represented by Vs, and the control gate voltage is represented by Vg. Flash memory is conventionally configured such that the wordline [WL] is the control gate (108) and the bitline [BL] connects to the drain (102).

The conventional cell is typically programmed by hot electron injection from the channel (the substrate region between the drain (102) and the source (104)) to the floating gate (106). This is typically achieved by applying a high positive voltage to both the drain (102) and the control gate (108) while grounding the source (104). Electrons are thus injected into the floating gate (106). When the cell has been programmed, there is a negative charge on the floating gate due to the electrons collected thereon. The negative charge raises the threshold voltage of the device as seen from the control gate (108). Hence, with the application of a positive voltage on the control gate (108), the transistor will not turn on, as long as the control gate voltage is lower than the cell threshold voltage.

The conventional cell is typically erased by cold electron tunneling by applying a high positive voltage to the source (104) or to the Pwell (101) while grounding the control gate (108). This causes electrons from the floating gate (106) to tunnel to the source (104). When the cell has been erased, the collection of electrons on the floating gate (106) has been removed. This reduces the threshold voltage of the device. Hence, when a positive voltage is applied to the control gate (108), the transistor will turn on.

Note that FIG. 1 is for purposes of illustration and is not drawn to scale. For example, source and drain may be more asymmetrical than is shown in FIG. 1, with different junction depths. Similarly, the other figures in this application are also for purposes of illustration are not drawn to scale.

FIG. 2 is a cross-sectional schematic diagram illustrating a conventional triple-well substrate configuration. The configuration includes a p doped substrate (202). Within the p doped substrate, a n doped well (204) is formed. Within the n doped well (204), a p doped well (101) is formed. It is on this Pwell (the triple Pwell) (101) that the cell shown in FIG. 1 is formed.

As discussed above, the present invention relates to isolating the substrate for each bitline (or column) of cells from the substrates of the other bitlines. This isolation is not feasible to achieve by creating separate Pwells during the Pwell implant because, at least for small bitline separations (for example, less than 0.5 micrometers given current technology), the separate Pwells would merge due to lateral diffusion. Hence, the present invention relates to using trenches to achieve the isolation. Two options for using trenches to achieve the isolation are illustrated in FIGS. 3A and 3B.

Figure 3A:
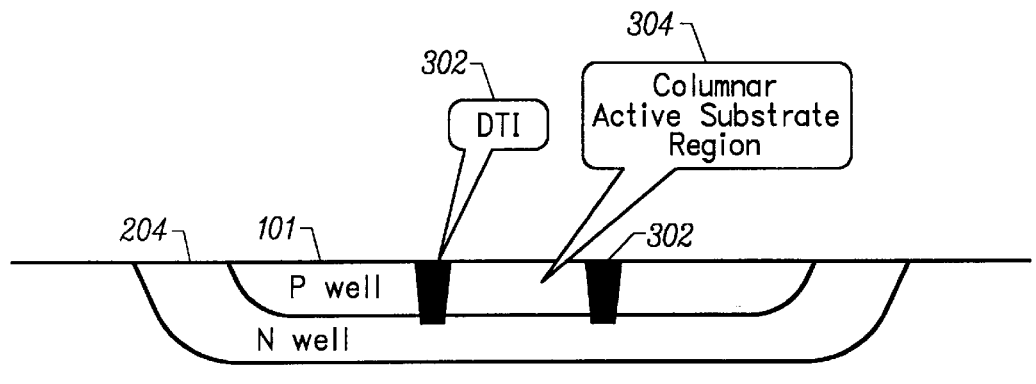
FIG. 3A is a cross-sectional schematic diagram illustrating a triple-well substrate configuration including deep trench isolation (DTI) in accordance with a preferred embodiment of the present invention.

FIG. 3A is a cross-sectional schematic diagram illustrating a triple-well substrate configuration including deep trench isolation (DTI) in accordance with a preferred embodiment of the present invention. In addition to the triple well substrate configuration of FIG. 2, the configuration of FIG. 3 includes a deep trench (302) which is filled with oxide. In a preferred embodiment, the deep trench (302) extends to a depth somewhat below the bottom of the Pwell (101) in order to ensure isolation of active substrate regions (304) within the Pwell (101). To ensure isolation along the sidewalls of the trenches (302), the sidewalls may be implanted with p-implant. P-implant in the trench sidewalls increases the threshold (turn on) voltage for the trenches thereby ensuring that they remain in the "off" state and serve as isolation regions.

Figure 3B:
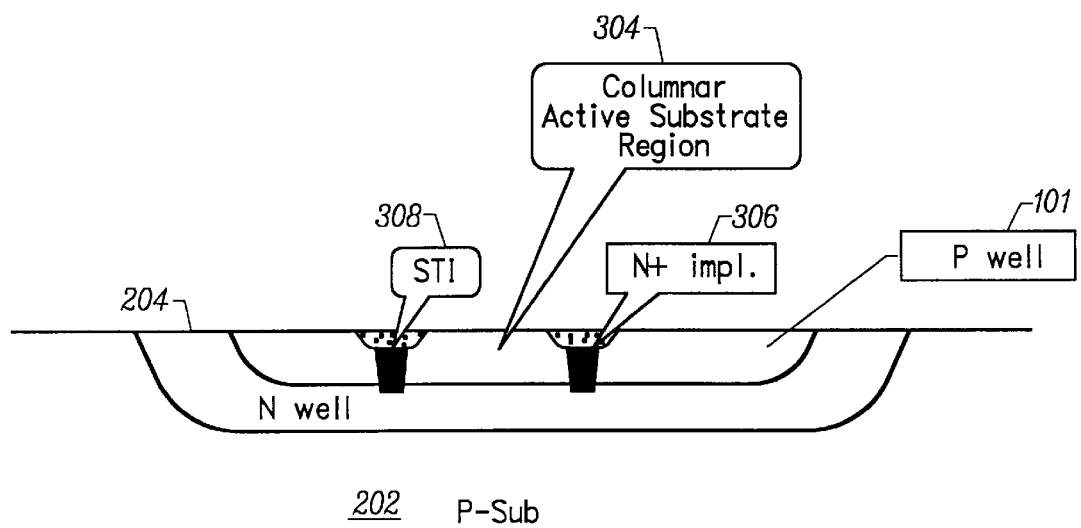
FIG. 3B is a cross-sectional schematic diagram illustrating a triple-well substrate configuration including shallow trench isolation (STI) in accordance with a preferred embodiment of the present invention.

FIG. 3B is a cross-sectional schematic diagram illustrating a triple-well substrate configuration including shallow trench isolation (STI) in accordance with a preferred embodiment of the present invention. Instead of using the deep trench isolation of FIG. 3A, the configuration of FIG. 3B uses a combination of a deep n+ implant (306) followed by a shallow trench (308) which is filled with oxide. It would be problematic to utilize n+ implant alone to fully isolate the active substrate regions (304) along the entire depth of the Pwell (101). So, instead, n+ implant (306) is used in the deep regions, and shallow trenches (308) filled with oxide are used in the shallow regions above the n+ implants.

Although for purposes of illustration only one active substrate region (304) is shown in FIGS. 3A and 3B, multiple active substrate regions (304) are formed in accordance with this invention. Each of the active substrate regions (304) being isolated from the other regions (304) by trenches (302 or 306+308), and each of the active substrate regions (304) comprising an isolated columnar substrate onto which a column of flash memory cells are formed.

Figure 3C:
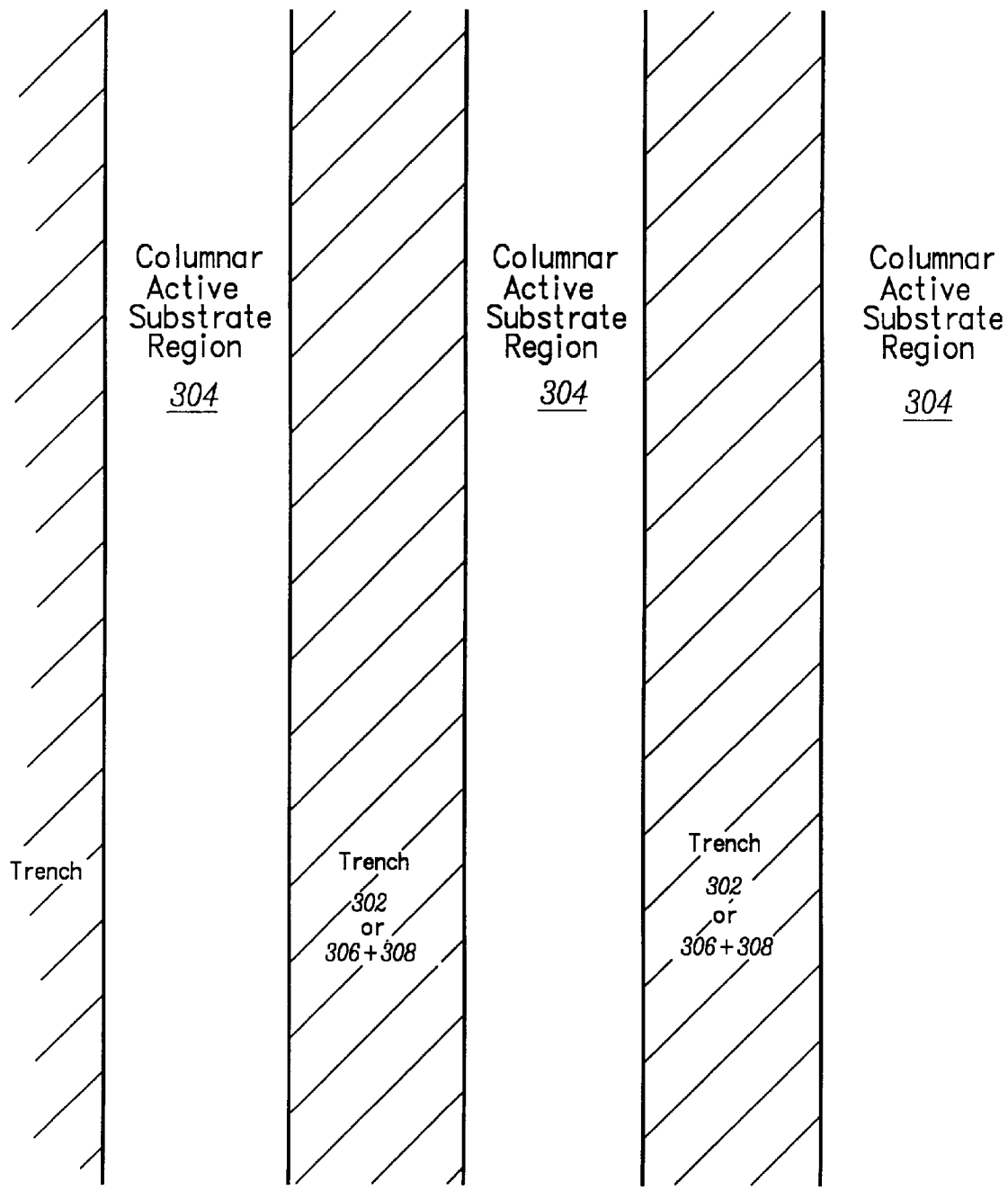
FIG. 3C is a top-view schematic layout illustrating trenches and active substrate regions in accordance with a preferred embodiment of the present invention.

FIG. 3C is a top-view schematic layout illustrating trenches (302 or 306+308) and multiple active substrate regions (304) in accordance with a preferred embodiment of the present invention. The multiple active substrate regions (304) are shown separated by the trenches (302 or 306+308) in a columnar configuration, where each isolated active substrate region (304) corresponds to a column or bitline.

Figure 4A:
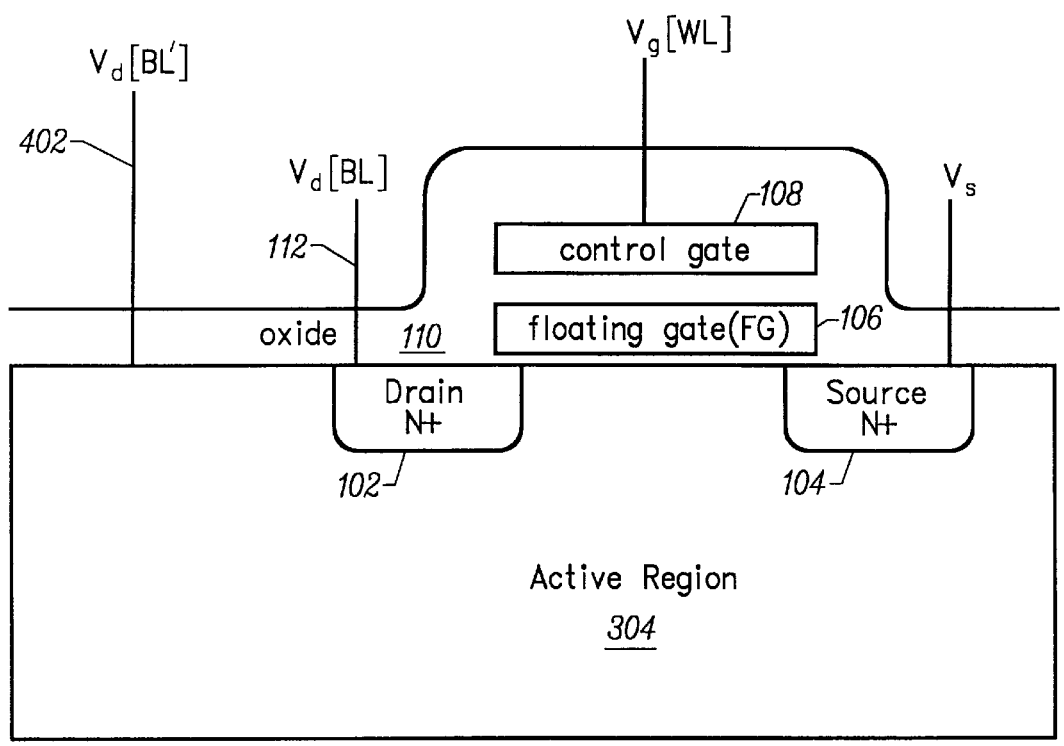
FIG. 4A is a cross-sectional schematic diagram illustrating a single-transistor flash memory cell along a bitline in accordance with a preferred embodiment of the present invention.

FIG. 4A is a cross-sectional schematic diagram illustrating a single-transistor flash memory cell along a bitline in accordance with a preferred embodiment of the present invention. The cell of FIG. 4 differs from the cell of FIG. 1 in a few significant aspects. First, the cell of FIG. 4 is formed on an isolated columnar active substrate region (304) of the substrate while the cell of FIG. 1 is not. Second, an electrical connection (402) is made to the isolated columnar active substrate region (304). Third, because of the electrical contact (402) to the isolated region (304), erasure of the cell may be performed using cold electron tunneling from the floating gate (106) to the isolated columnar active substrate region (304). Hence, the electrical connection (402) may be used as a sort of second bitline [BL'] for purposes of program and erase, while the first bitline [BL] may be used for purposes of read only (and allowed to float during program and erase). Fourth, no source contact (114) is needed because local interconnect is used to connect to the sources (104).

Figure 4B:
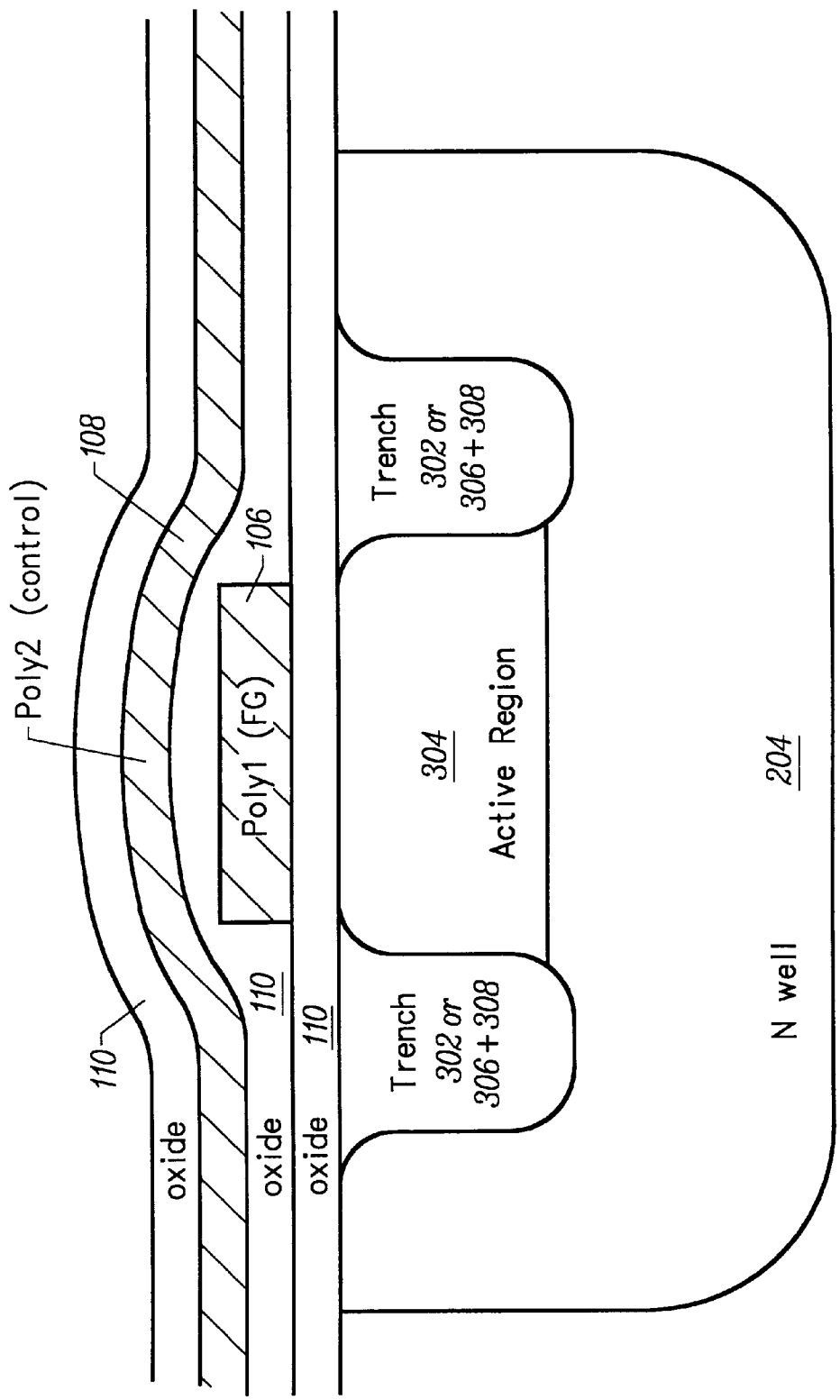
FIG. 4B is a cross-sectional schematic diagram illustrating a single-transistor flash memory cell along a wordline in accordance with a preferred embodiment of the present invention.

FIG. 4B is a cross-sectional schematic diagram illustrating a single-transistor flash memory cell along a wordline in accordance with a preferred embodiment of the present invention. As shown in FIG. 4B, the floating gate (106) is formed by a first polysilicon layer (poly1), and the control gate (108) is formed by a second polysilicon layer (poly2).

As discussed above, the present invention also relates to providing for connections to the flash cells, including separate access to each columnar active substrate region (304). Three options for providing for the connections are illustrated in FIGS. 5A, 5B, and 5C.

Figure 5A:
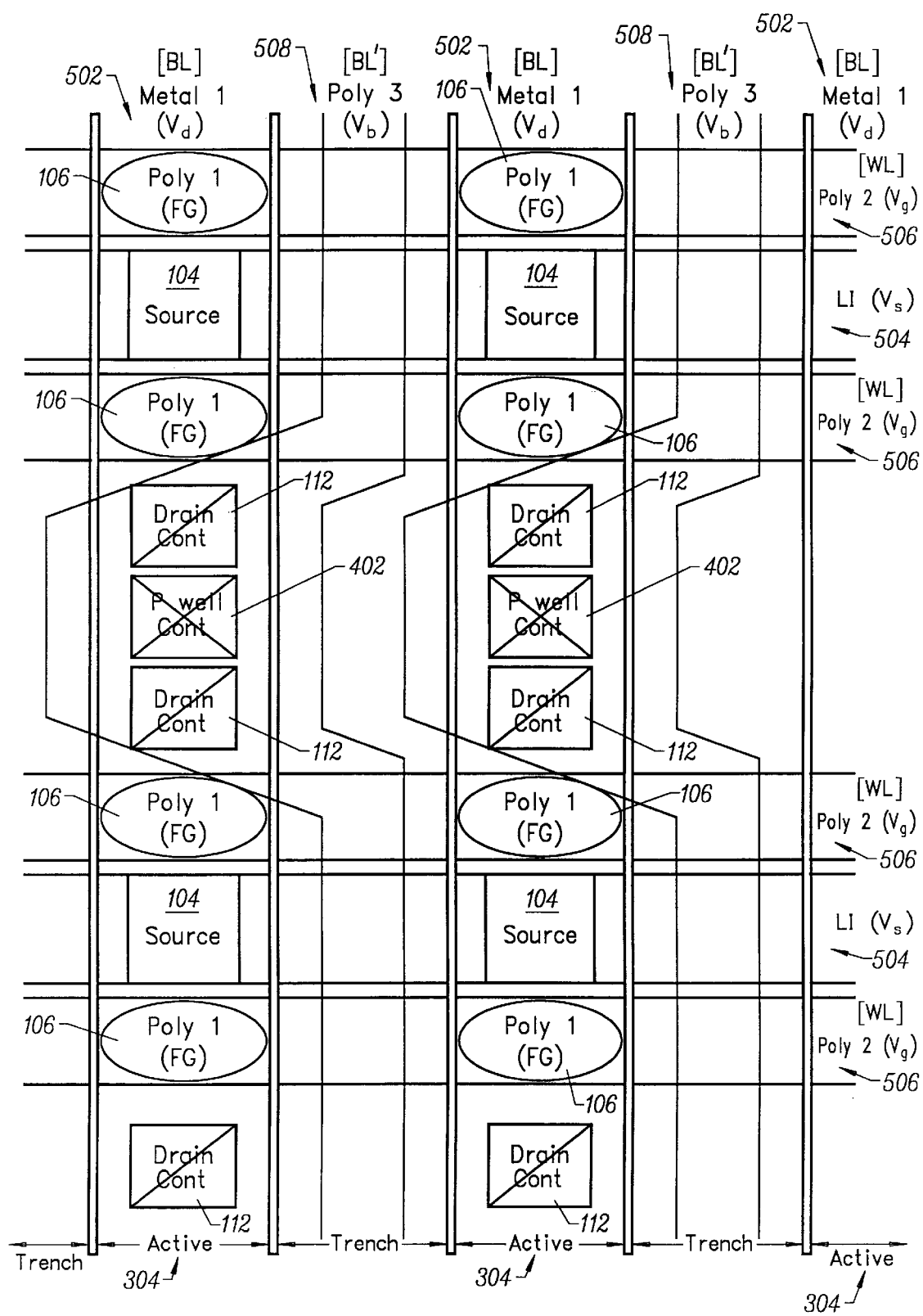
FIG. 5A is a first top-view schematic layout illustrating connection layers and contacts to flash memory cells in accordance with a preferred embodiment of the present invention.
Figure 5B:
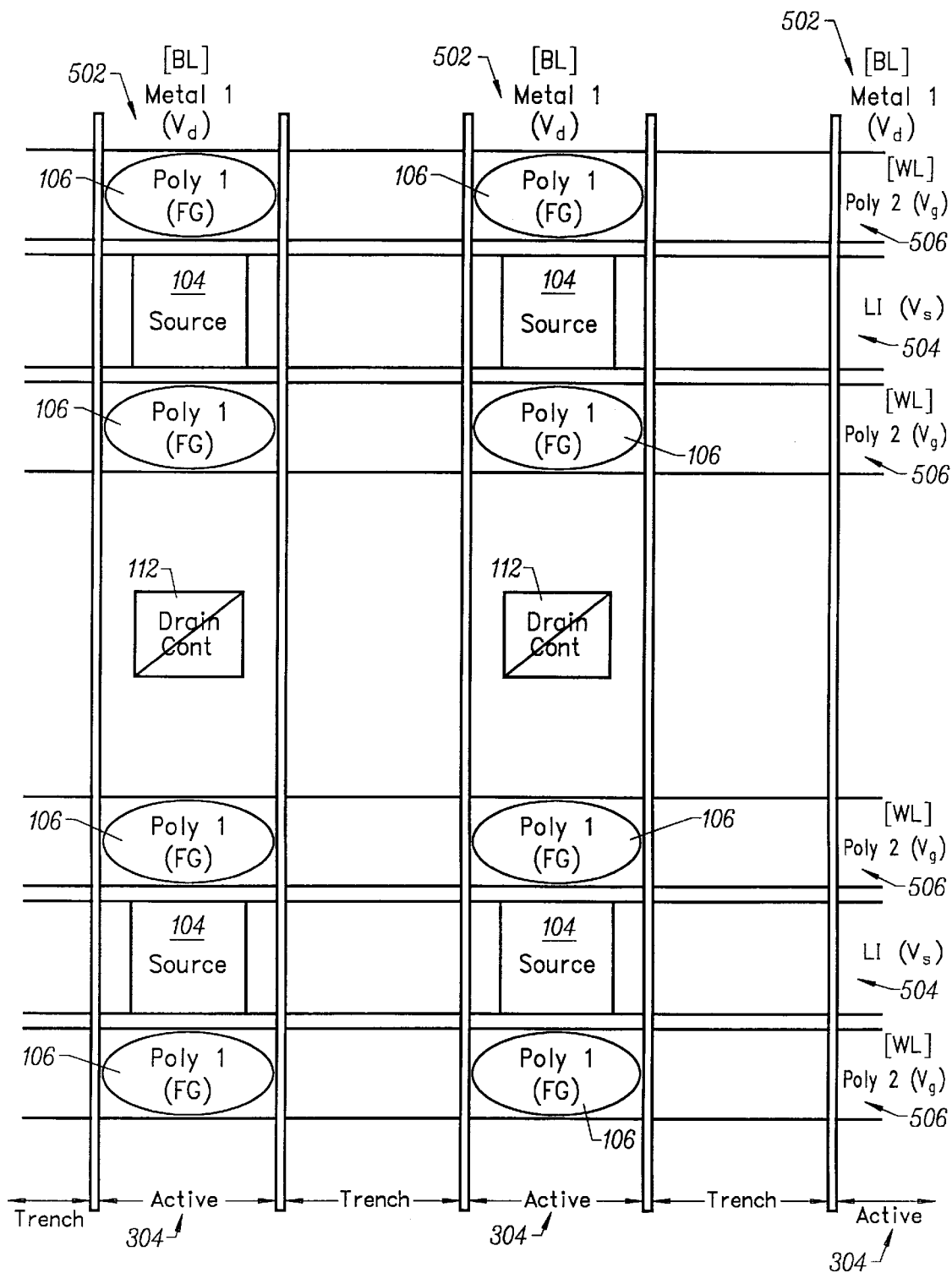
FIG. 5B is a second top-view schematic layout illustrating connection layers and contacts to flash memory cells in accordance with a preferred embodiment of the present invention.
Figure 5C:
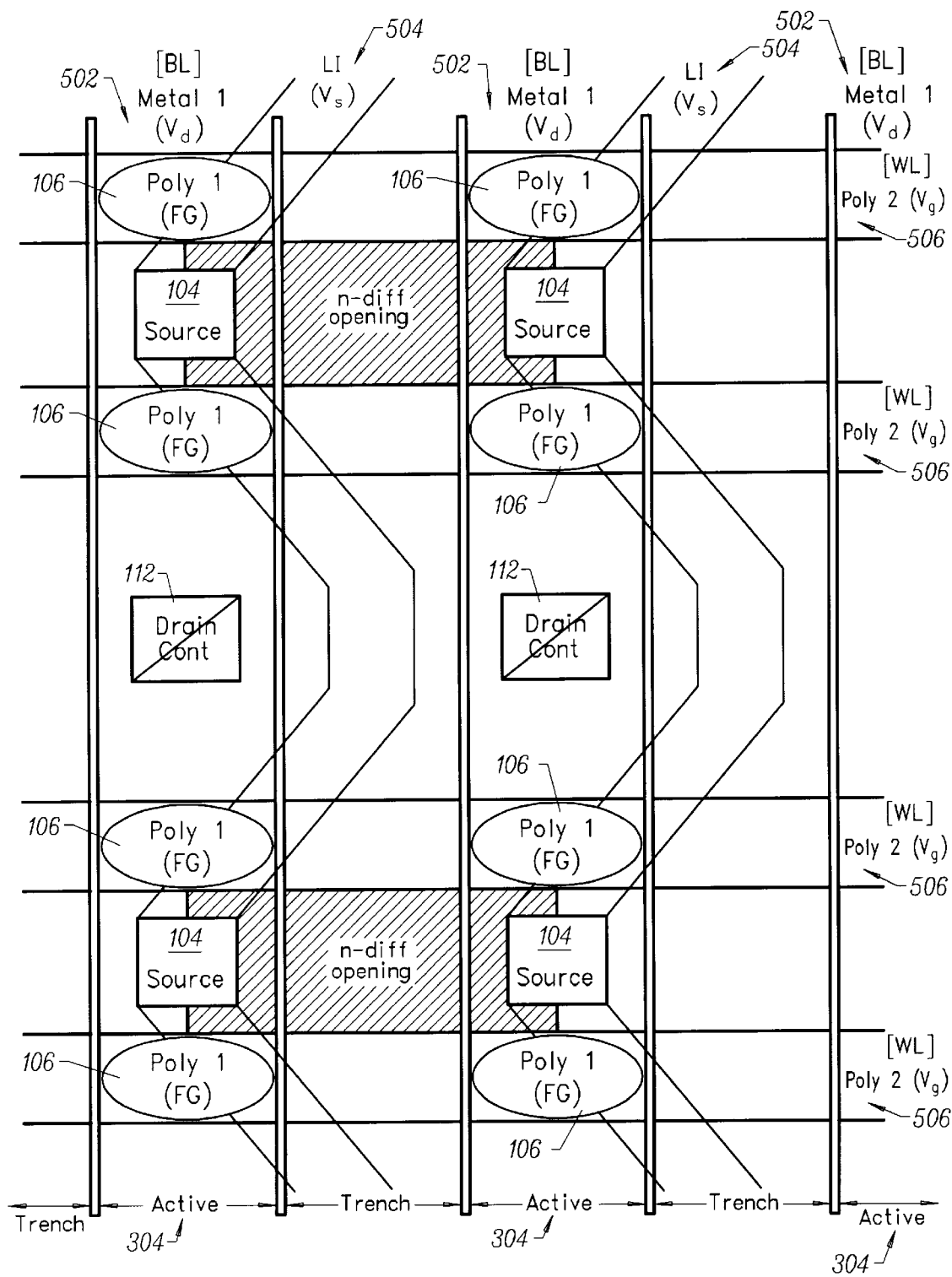
FIG. 5C is a third top-view schematic layout illustrating connection layers and contacts to flash memory cells in accordance with a preferred embodiment of the present invention.

FIG. 5A is a first top-view schematic layout illustrating connection layers and contacts to flash memory cells in accordance with a preferred embodiment of the present invention. The first layout includes floating gates (FG) (106), drain contacts (112), Pwell contacts (402), drain lines [BL] (502), source lines (504), control lines [WL] (506), and substrate lines [BL'] (508). Note that the layout dimensions are meant for purposes of illustration and are not meant to be exact. In addition, the Pwell contacts (402) need not be made for every cell or pair of cells, but only as often as needed to keep the columnar substrate resistance sufficiently low.

In the first layout, the floating gates (106) are shown as formed from a first polysilicon layer (poly1). The floating gates (106), of course, float in that they are surrounded by silicon dioxide and hence there are no direct connections to them. The drain lines (502) are shown as formed from a first metal layer (metal1) and are connected to the drains (102) via the drain contacts (112). Voltages on the drain lines (502) are represented by Vd. The source lines (504) are shown as formed from local interconnect (LI) and are connected to the sources (104). Because local interconnect is used, no source contact is needed to connect to each source (104). Voltages on the source lines (504) are represented by Vs. As shown in FIG. 5A, the source lines (104) comprise common source lines which are each shared by a pair of rows of cells. Local interconnect is a metal conductor capable of crossing isolation regions such as trenches. Local interconnect is also situated in a different level than regular metal (aluminum) or polysilicon, allowing it to cross those conductors. In a preferred embodiment, the local interconnect comprises tungsten. The control lines (506) are shown as formed from a second polysilicon layer (poly2). Above each floating gate (106), a control gate (108) is formed by a control line (506). Voltages on the control lines (506) are represented by Vg. Finally, the substrate lines (508) are shown to be formed from a third polysilicon layer (poly3) and are connected to the isolated columnar active substrate regions (304) via the Pwell contacts (402). Voltages on the substrate lines (508) are represented by Vb.

The Pwell contacts (402) shown in FIG. 5A comprise in-array contacts to the isolated columnar active substrate regions (304). Such contacts (402) along the columns are necessary for cases where substrate resistance is sufficiently high to require them. Otherwise, if contacts are only made at the ends of the columnar active substrate regions (304), then the voltage drops due to the substrate resistance would substantially effect the substrate voltage (Vb) at cells towards the middle of the columns. An estimated cell size with the first layout using 0.25 micron fabrication technology would be 0.75 microns (along the row direction)×1.1 microns (along the column direction)=0.825 square microns.

FIG. 5B is a second top-view schematic layout illustrating connection layers and contacts to flash memory cells in accordance with a preferred embodiment of the present invention. In comparison with the first layout in FIG. 5A, the second layout in FIG. 5B includes neither in-array Pwell contacts (402) nor substrate lines (508). In this case, contacts (not shown) are only made at the ends of the columnar active substrate regions (304) because substrate resistance is sufficiently low. The second bit lines [BL'] (not shown), which are utilized during program and erase, are connected to these end-of-column contacts. Without the in-array Pwell contacts (402), the second layout should allow for a smaller cell size than the first layout. An estimated cell size with the second layout using 0.25 micron fabrication technology would be 0.75 microns (along the row direction)×0.9 microns (along the column direction)=0.675 square microns.

FIG. 5C is a third top-view schematic layout illustrating connection layers and contacts to flash memory cells in accordance with a preferred embodiment of the present invention. In comparison with the second layout in FIG. 5B, the third layout in FIG. 5C includes a different configuration for the source lines (504). Like the second layout, the third layout does not include in-array Pwell contacts (402) and hence has an estimated cell size of 0.675 square microns using 0.25 micron fabrication technology.

The n-diffusion opening areas drawn in FIG. 5C designate openings in the mask used for n-diffusion implantation. The diffusion regions will only be formed in the active regions, and therefore the sources (104) of cells located along the same wordline will not be connected.

In the connection scheme presented in FIG. 5C, the source (104) of a selected cell is permanently connected to the substrate (304). In a conventional scheme, a common source is typically grounded during program operation and either floating (for channel erase) or under positive voltage (for source erase) during erase operation. In the present scheme, the source (104) cannot be kept floating during erase operation, but this does not preclude erasing the cell. For programming operation, all sources are connected together which can be realized by tying all LI lines.

Table 1 shows an example of operational conditions for a flash memory cell in accordance with the present invention. The voltages shown in Table 1 are for purposes of illustration only and are meant to be neither exact nor limiting.

TABLE 1

| Operation | Operational Conditions | | | |
|---|---|---|---|---|
| | Vg [WL] | Vd [BL] | Vb [BL'] | Vs |
| Program | 9 V | float | −7 V | float |
| Erase | −8 V | float | 9 V | float |
| Read | 4 V | 0.8 V | 0 V | 0 V |
| Program Inhibit | 9 V | float | 0 V | float |

Note that while the source voltage Vs is shown as floating during certain operations in the above table, the source voltage Vs is actually allowed to float only under the layout schemes of FIGS. 5A and 5B. Under the layout scheme of FIG. 5C, the source voltage Vs would generally be equal to the substrate voltage Vb.

The present invention is advantageous in several aspects. First, flash memory in accordance with the present invention is well suited for multi-level storage operation in which more than 1 bit of information is stored per cell. The independent access to each of the columnar regions (304) provides a capability for achieving more precise control over the voltages stored on the floating gates (106). More precise control over the stored voltages is required for multi-level storage. Since each bitline may be accessed individually during erase, as well as during programming, a capability is provided to correct for any "overshoot" during the programming of a bit. Programming algorithms may use this capability in order to achieve the storage of more precise voltage levels which is needed for multi-level storage. In addition, additional precision in the control of the stored voltage levels is provided by the present invention because both programming and erase utilize a tunneling mechanism, instead of an injection mechanism.

Second, the independent access to each of these columnar regions (304) provides a capability for areas of flash memory smaller than an entire sector to be erased at one time. As few as one or two wordlines (also called rows) may be erased at one time by applying a high negative voltage to control gates (108) of the selected wordline, a small positive voltage to the control gates (108) of the unselected wordlines, and a high positive voltage to the active substrate regions (304), while allowing the sources (104) and drains (102) to float. In this case, the n-polarity source line (504) corresponding to the selected wordline (108) floats to a level near to the positive voltage of the active substrate regions (304). Hence, if each wordline has its own source line (504), then one wordline at a time may be so erased. Alternatively, if two neighboring wordlines share a common source line (504), then two neighboring wordlines at a time may be so erased.

Moreover, even smaller than one or two word lines, a single cell may be erased by applying a high negative voltage to the control gates (108) in a selected wordline, grounding the columnar active substrate region (304) corresponding to a particular bitline, and allowing the drains (102) and sources (104) to float. In this case, no voltage is induced in the floating source line (504). Hence, a single cell may be erased.

Finally, since both programming and erasing is achieved by way of cold electron tunneling from the columnar active substrate region (304), no high voltages need to be applied to either the drain (102) or source (104). As can be seen from Table 1, the highest voltage applied between drain and source occurs during the read operation and is less than one volt. This reduces the minimum distance required by cell punchthrough; hence, the size of the cell may be reduced along the columnar direction. As a result, higher densities of flash memory may be achieved.

What is claimed is:

1. A flash memory comprising:

a semiconductor substrate;

a plurality of trenches separating the semiconductor substrate into a plurality of columnar active substrate regions;

a plurality of flash memory cells formed in each of the columnar active substrate regions; and circuitry for providing independent electronic access to each of the columnar active substrate regions, where the semiconductor substrate includes a multiple well structure, and the trenches extend for an entire depth of a top well of the triple well structure.

2. The flash memory of claim 1, where the trenches comprise deep trenches filled with oxide.

3. The flash memory of claim 1, where the trenches comprise deep ion implants below shallow trenches filled with oxide.

4. The flash memory of claim 1, where the circuitry for providing independent electronic access includes contacts at ends of the columnar active substrate regions.

5. The flash memory of claim 1, where the circuitry for providing independent electronic access includes in-array contacts to the columnar active substrate regions.

6. The flash memory of claim 1, where connections to sources of the flash memory cells are formed using local interconnect.

7. The flash memory of claim 1, where individual access to bitlines during erase is provided by way of the columnar active substrate regions.

8. The flash memory of claim 7, where during programming an algorithm uses the individual access to bitlines to correct for overshoot.

9. The flash memory of claim 8, where more than one bit of data is stored per memory cell.

10. The flash memory of claim 1, where an area smaller than an entire sector is erased at one time.

11. The flash memory of claim 10, where the area comprises one wordline.

12. The flash memory of claim 10, where common source lines are used, and the area comprises two wordlines.

13. The flash memory of claim 10, where the area comprises a single cell.

14. The flash memory of claim 1, where during operation of the flash memory only low magnitude voltages are applied to drains and sources of the flash memory cells.

15. The flash memory of claim 14, where during operation a maximum magnitude voltage of less than one volt is applied to the drains and sources of the flash memory cells, and the maximum magnitude voltage is applied during a read operation.

16. The flash memory of claim 14, where a minimum distance required by cell punchthrough is thereby reduced, and so higher density of the flash memory cells is achieved.

17. The flash memory of claim 1, further comprising:

floating gates of the flash memory cells;

a set of wordlines including control gates of the flash memory cells;

drain contacts through oxide to drains of the flash memory cells;

a set of drain lines connecting to the drain contacts;

a set of source lines connecting to sources of the flash memory cell;

substrate contacts through oxide to the columnar active substrate regions; and a set of substrate lines connecting to the substrate contacts, the set of substrate lines providing for the independent electronic access to each of the columnar active substrate regions.

18. The flash memory of claim 17, where the set of source lines comprise a local interconnect layer.

19. The flash memory of claim 18, where the local interconnect layer comprises tungsten.

20. The flash memory of claim 17, where the set of source lines comprise a local interconnect layer;

the set of drain lines comprise a first metal layer;

the floating gates comprise a first polysilicon layer;

the set of wordlines comprise a second polysilicon layer; and the set of substrate lines comprise a third polysilicon layer.

21. The flash memory of claim 17, where the set of drain lines comprise a first set of bitlines, and the set of substrate lines comprise a second set of bitlines.

22. The flash memory of claim 21, where the first set of bitlines is used to provide access to the flash memory cells during read operations, and the second set of bitlines is used to provide access to the flash memory cells during program and erase operations.

* * * * *